US012716909B2

(12) United States Patent
Burnette et al.

(10) Patent No.: US 12,716,909 B2
(45) Date of Patent: Aug. 25, 2026

(54) SYSTEM AND METHOD OF USER AFFORDANCE AND ACTUATION

(71) Applicant: UNIVERSAL CITY STUDIOS LLC, Universal City, CA (US)

(72) Inventors: Brandon Burnette, Philadelphia, PA (US); Colin Wlodkowski, Philadelphia, PA (US); Jasmine Wai Mai, Colma, CA (US); Lukas Marcelis, Alexandria, VA (US); Lillian Anderson Kuntz, Philadelphia, PA (US)

(73) Assignee: Universal City Studios LLC, Universal City, CA (US)

( * ) Notice: Subject to any disclaimer, the term of this patent is extended or adjusted under 35 U.S.C. 154(b) by 22 days.

(21) Appl. No.: 18/646,494

(22) Filed: Apr. 25, 2024

(65) Prior Publication Data

US 2025/0334604 A1 Oct. 30, 2025

(51) Int. Cl.
*G01P 3/66* (2006.01)
*A63F 13/21* (2014.01)
(Continued)

(52) U.S. Cl.
CPC .............. *G01P 3/665* (2013.01); *A63F 13/21* (2014.09); *A63F 13/23* (2014.09); *A63F 13/235* (2014.09); *G01P 15/003* (2013.01); *G01R 33/02* (2013.01); *G07F 17/3253* (2013.01); *G07F 17/3297* (2013.01); *A63F 13/211* (2014.09); *A63F 13/245* (2014.09); *G06F 3/0346* (2013.01)

(58) Field of Classification Search
CPC .......... G01P 3/665; G01P 15/003; G01P 3/44; G01P 3/486; G01P 3/487; G01P 3/489; G01R 33/02; G07F 17/3253; G07F 17/3297; A63F 13/21; A63F 13/23; A63F 13/235; A63F 13/245; A63F 13/211; G06F 3/0346; G01D 5/2451
USPC .......................................................... 324/179
See application file for complete search history.

(56) References Cited

U.S. PATENT DOCUMENTS 8,368,648 B2 2/2013 Barney et al.
8,708,821 B2 4/2014 Barney et al.
(Continued)

OTHER PUBLICATIONS

PCT/US2025/026273 International Search Report and Written Opinion mailed Sep. 12, 2025.

*Primary Examiner* — Raul J Rios Russo
(74) *Attorney, Agent, or Firm* — Fletcher Yoder, P.C.

(57) ABSTRACT

Aspects of the disclosure relate to methods, apparatus, and systems for triggering an action while a device is separated from a user and traveling toward a target. A system includes a device and a triggering apparatus. The device is configured to measure a magnetic field strength, a device acceleration, and/or a device angular velocity while the device is separated from a user and traveling toward a target, and send the measured magnetic field strength, the measured acceleration, and/or the measured angular velocity to the triggering apparatus while the device is separated from the user and traveling toward the target. The triggering apparatus is configured to receive the measured magnetic field strength, the measured acceleration, and/or the measured angular velocity from the device, and determine whether to trigger an action based on an analysis of the measured magnetic field strength, the measured acceleration, and/or the measured angular velocity.

20 Claims, 9 Drawing Sheets

(51) Int. Cl.

| | |
|---|---|
| ***A63F 13/211*** | (2014.01) |
| ***A63F 13/23*** | (2014.01) |
| ***A63F 13/235*** | (2014.01) |
| ***A63F 13/245*** | (2014.01) |
| ***G01P 15/00*** | (2006.01) |
| ***G01R 33/02*** | (2006.01) |
| ***G06F 3/0346*** | (2013.01) |
| ***G07F 17/32*** | (2006.01) |

(56) References Cited

U.S. PATENT DOCUMENTS

| | | | | |
|---|---|---|---|---|
| 9,446,319 | B2 | 9/2016 | Barney et al. | |
| 9,713,766 | B2 | 7/2017 | Barney et al. | |
| 11,052,309 | B2 | 7/2021 | Barney et al. | |
| 2010/0248844 | A1 * | 9/2010 | Nakajima ............. | A63F 13/428<br>463/43 |
| 2013/0059658 | A1 * | 3/2013 | Shimamura ........... | A63F 13/211<br>463/43 |
| 2015/0107358 | A1 * | 4/2015 | Parke ................... | G01C 25/005<br>73/514.02 |
| 2016/0059075 | A1 | 3/2016 | Molyneux et al. | |
| 2016/0332049 | A1 * | 11/2016 | Stites ................. | A63B 69/3632 |
| 2018/0253905 | A1 | 9/2018 | McCracken et al. | |
| 2019/0126139 | A1 * | 5/2019 | Goslin .................... | A63F 13/22 |
| 2019/0358514 | A1 | 11/2019 | Kersteman | |

* cited by examiner

700

702 Receive throw data from a device

704 High magnetic field strength?

NO

706 Forgo triggering action

YES

708 Read magnetic field strength in combination with acceleration and/or angular velocity 710 Trigger action based on analyzed data 712 Associate prize with device identification 714 Store device identification and associated prize in database

SYSTEM AND METHOD OF USER AFFORDANCE AND ACTUATION

TECHNICAL FIELD

The technology discussed below relates generally to interactive attractions in an amusement park setting, and more particularly, to a system and method of facilitating a device to operate with an interactive attraction and trigger an action when separated from a user and without using sensors external to the device.

INTRODUCTION

An interactive attraction in an amusement park setting may involve a device or object (e.g., wand, wristband, gun) affixed to, or held by, a user (e.g., park guest). When the user engages the attraction with the device, external sensors (sensors external to the device) operationally coupled to the attraction may capture a modality of the device and trigger a corresponding show element (or effect) associated with the attraction. For example, the device may be a wand obtained (e.g., purchased) by the user at the park and the attraction may include a window with cameras configured to capture movements of the wand. Accordingly, when the user makes gestures with the wand in front of the window, the cameras may capture the wand's motions and consequently trigger motorized set pieces and/or lights to provide a show for the user. In another example, the device may be a wristband worn on the wrist of the user. Accordingly, the user may trigger an effect when the wristband is within a predetermined range of a sensor.

Notably, interactive attractions implementing a current device, as described above, are dependent on external sensors to respond to user interaction. That is, the user must move or hold the device in close proximity to a sensor in order to affect an environment around the device (e.g., trigger a show element/effect). However, when the current device is at a distance beyond the sensor's sensing range, the sensor cannot detect the presence of the device, rendering the device useless for affecting the environment around the device. Moreover, the current device has no functionality when separated from the user. For example, when the device (e.g., wand or wristband) is not held or worn by the user, the device is incapable of performing any operations, and therefore, cannot be used to affect a surrounding environment. Accordingly, aspects of the present disclosure are directed to a device that is capable of affecting an environment around the device (e.g., trigger a show element/effect) when separated from a user/guest. In an aspect, a modality of the device as the device exits a personal space of the user (e.g., when the device is thrown away from the user) is used to affect a surrounding environment. In a further aspect, the device does not need to be detected by an external sensor in order to affect the surrounding environment.

BRIEF SUMMARY OF SOME EXAMPLES

The following presents a summary of one or more aspects of the present disclosure, in order to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a simplified form as a prelude to the more detailed description that is presented later.

Aspects of the disclosure relate to methods, apparatus, and systems for triggering an action while a device is separated from a user and traveling toward a target. A system includes a device and a triggering apparatus. The device is configured to measure a magnetic field strength, a device acceleration, and/or a device angular velocity while the device is separated from a user and traveling toward a target, and send the measured magnetic field strength, the measured acceleration, and/or the measured angular velocity to the triggering apparatus while the device is separated from the user and traveling toward the target. The triggering apparatus is configured to receive the measured magnetic field strength, the measured acceleration, and/or the measured angular velocity from the device, and determine whether to trigger an action based on an analysis of the measured magnetic field strength, the measured acceleration, and/or the measured angular velocity. Other aspects, embodiments, and features are also claimed and described.

In one example, a device for triggering an action when separated from a user is disclosed. The device includes one or more transceivers, one or more sensors, and a controller coupled to the one or more transceivers and the one or more sensors. The controller is configured to detect, via the one or more sensors, a start of a device throw toward a target, wherein the device is separated from a user during the device throw, measure, via the one or more sensors, at least one of a magnetic field strength, an acceleration of the device, or an angular velocity of the device during the device throw, and send, via the one or more transceivers, the at least one of the measured magnetic field strength, the measured acceleration, or the measured angular velocity to a second device during the device throw to trigger an action via the second device. The controller is further configured to send, via the one or more transceivers, a device identification to the second device, detect, via the one or more sensors, an end of the device throw, and cease measurement of the at least one of the magnetic field strength, the acceleration, or the angular velocity when the end of the device throw is detected.

In one example, a method of a device for triggering an action when the device is separated from a user is disclosed. The method includes detecting a start of a device throw toward a target, wherein the device is separated from a user during the device throw, measuring at least one of a magnetic field strength, an acceleration of the device, or an angular velocity of the device during the device throw, and sending the at least one of the measured magnetic field strength, the measured acceleration, or the measured angular velocity to a second device during the device throw to trigger an action via the second device. The method further includes sending a device identification to the second device, detecting an end of the device throw, and ceasing measurement of the at least one of the magnetic field strength, the acceleration, or the angular velocity when the end of the device throw is detected.

In one example, an apparatus for triggering an action based on throw data received from a device while the device is separated from a user is disclosed. The apparatus includes one or more transceivers and a controller coupled to the one or more transceivers. The controller is configured to receive, via the one or more transceivers, throw data from a device while the device is separated from a user and traveling toward a target, wherein the throw data comprises at least one of a magnetic field strength, an acceleration of the device, or an angular velocity of the device as measured by the device, analyze the throw data, and determine whether to trigger the action based on the analyzed throw data.

In one example, a method of an apparatus for triggering an action based on throw data received from a device while the device is separated from a user is disclosed. The method includes receiving throw data from a device while the device is separated from a user and traveling toward a target, wherein the throw data comprises at least one of a magnetic field strength, an acceleration of the device, or an angular velocity of the device as measured by the device, analyzing the throw data, and determining whether to trigger the action based on the analyzed throw data.

In one example, an apparatus for accessing a database to recall prize data associated with a device is disclosed. The apparatus includes one or more transceivers, a display screen, and a controller coupled to the one or more transceivers and the display screen. The controller is configured to receive a device identification, access, via the one or more transceivers, a database to request prize data associated with the device identification, receive, from the database via the one or more transceivers, the prize data associated with the device identification, display the prize data on the display screen, and select the prize data for use in a game running on the apparatus.

In one example, a method of an apparatus for accessing a database to recall prize data associated with a device is disclosed. The method includes receiving a device identification, accessing a database to request prize data associated with the device identification, receiving, from the database, the prize data associated with the device identification, displaying the prize data on a display screen of the apparatus, and selecting the prize data for use in a game running on the apparatus.

DETAILED DESCRIPTION

Figure 1:
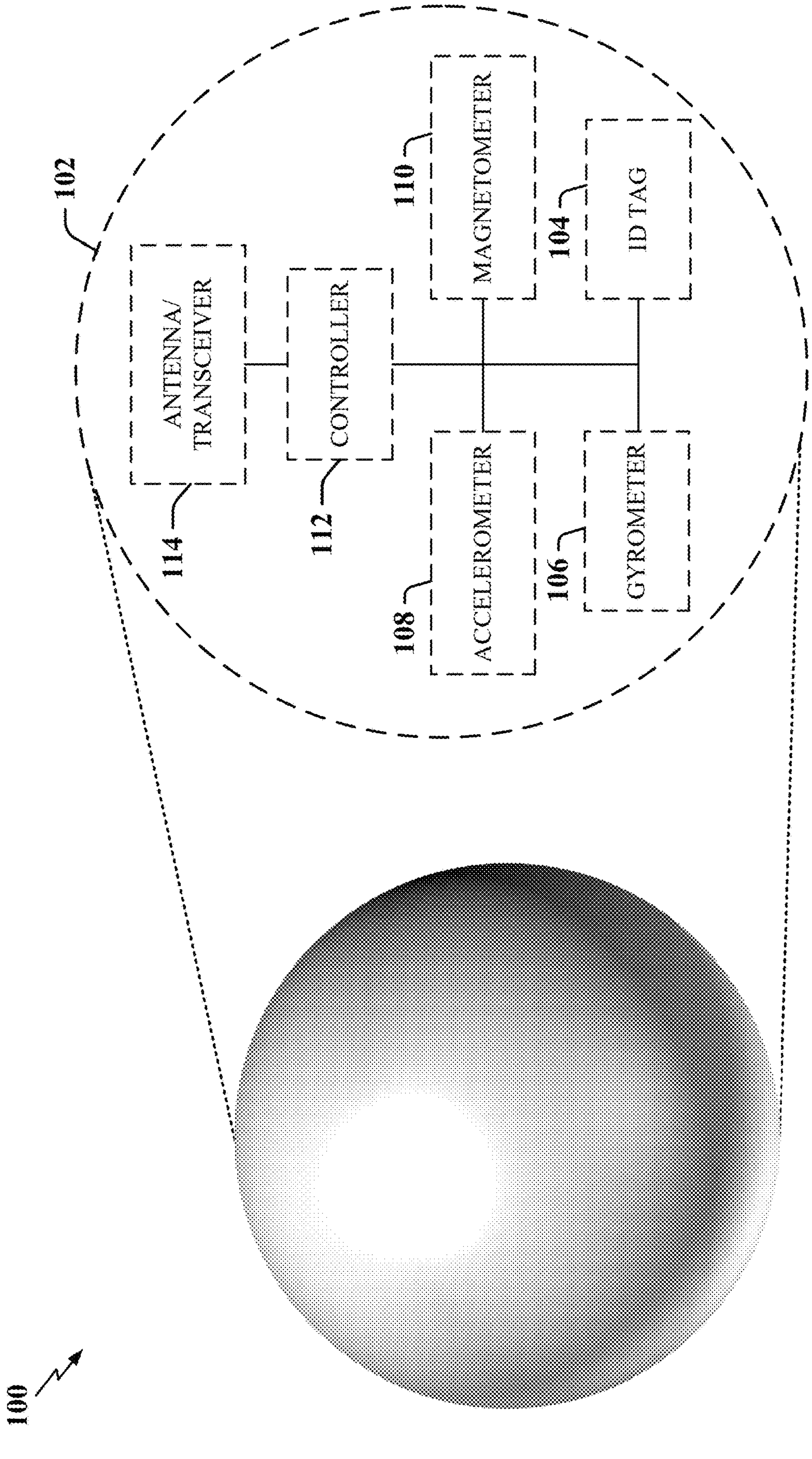
FIG. 1 illustrates an example device according to an aspect of the present disclosure.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts. While aspects and embodiments are described in this application by illustration to some examples, those skilled in the art will understand that additional implementations and use cases may come about in many different arrangements and scenarios. Innovations described herein may be implemented across many differing platform types, devices, systems, shapes, sizes, and/or packaging arrangements.

Interactive attractions in an amusement park setting may use devices that are dependent on external sensors to respond to user interaction and affect a surrounding environment (e.g., trigger an action or a show element/effect). However, the external sensor-dependent devices are problematic in that the devices are incapable of affecting the environment when located outside of a sensor range or when not held (or worn) by a user. Accordingly, what is needed is a device that operates with an interactive attraction that is capable of triggering an action or a show element/effect without the use of external sensors and when separated from the user.

Aspects of the disclosure relate to an interactive device capable of being held or carried by a user (e.g., park guest). The device includes one or more sensors housed within the device that are configured to monitor an acceleration of the device, a rotation of the device (e.g., angular velocity), and/or a magnetic field near the device. The one or more sensors monitor and gather data related to the acceleration, rotation, and/or magnetic field based on how the user interacts with the device. For example, if the user throws the device toward a target, the one or more sensors may monitor and gather the acceleration, angular velocity, and/or magnetic field data based on how the device is thrown. The gathered data may then be input to an algorithm to determine what occurred during an interaction (e.g., how well the device was thrown) and subsequently trigger an effect/action (e.g., game reward) based on the data. In an aspect, data such as a speed of the thrown device, an amount of rotation while the device travels through air, and/or a proximity of the device to a magnetic target may trigger a show element, effect, or event for the user's enjoyment. Accordingly, the device increases the user's engagement and immersion with a theme park attraction by having the user's actions (e.g., throwing the device) directly drive what occurs in an environment of the attraction. In an aspect, different user actions (e.g., different throw styles) may be uniquely rewarded.

FIG. 1 illustrates an example device 100 according to an aspect of the present disclosure. As shown, the device 100 has a spherical shape. However, it is contemplated that the device may have any size and/or shape that is suitable for being held or carried by a user (e.g., theme park guest). In an aspect, the device 100 is configured to operate with a user interactive system (e.g., theme park interactive attraction), wherein the device 100 may trigger an action or a show element, effect, and/or event associated with the interactive system based on how the device 100 is thrown by the user.

An inner structure 102 of the device 100 houses a plurality of components. For example, the inner structure 102 may include an identification (ID) tag 104 (e.g., radio frequency identification (RFID) tag, near field communications (NFC) tag, etc.), a gyrometer 106, an accelerometer 108, a magnetometer 110, a controller 112, and an antenna/transceiver 114. The ID tag 104 uniquely identifies the device 100 and allows for the device 100 to interface with other devices outside of the theme park (e.g., user's game device, mobile phone, computer, or any other device). In an aspect, the ID tag 104 may be used to keep track of data (e.g., device data and/or user data) and record results of past user interactions for use in future interactions.

The gyrometer 106 may be configured to measure a rotation of the device (e.g., angular rate). For example, the gyrometer 106 may measure the orientation of the device with respect to gravity. The accelerometer 108 may be configured to measure an acceleration of the device and/or a force exerted on the device (e.g., such as when the device is thrown by the user). The magnetometer 110 may be configured to detect magnetism. In an aspect, an electromagnet may be used to induce a magnetic field in a target area of the interactive attraction. Accordingly, when the device is thrown by the user toward the target area, the magnetometer 110 may detect a level of magnetic force based on the device's proximity to the electromagnet. As such, the level of magnetic force detected may indicate how successful the user was in hitting the target area when throwing the device.

In an aspect, the gyrometer 106, the accelerometer 108, and the magnetometer 110 may collectively be referred to as an inertial measurement unit (IMU) or IMU sensor suite. Generally, the IMU is an electronic apparatus that measures and reports the device's specific force, angular rate, and/or orientation using some combination of the gyrometer 106, the accelerometer 108, and the magnetometer 110. Accordingly, a modality of the device (e.g., speed, rotation, proximity to target) as it departs from the user's hand may be determined by the IMU and used to drive an interactive experience with a theme park attraction.

The controller 112 (e.g., integrated controller) may be configured to communicate with elements within the device 100. For example, the controller 112 may communicate signals (e.g., information, data, etc.) to and from the ID tag 104, the gyrometer 106, the accelerometer 108, and/or the magnetometer 110. Moreover, the controller 112 may be configured to communicate with elements external to the device 100 via the antenna/transceiver 114. For example, the controller 112 may use the antenna/transceiver 114 to communicate signals (e.g., information, data, etc.) over a network to and from various systems and devices, such as the theme park attraction, the user's mobile phone, a database, or any computing device located inside and/or outside the theme park. In an aspect, the controller 112 may wirelessly interface with the systems and/or devices via a wireless communication technology, such as Wi-Fi or Bluetooth. Furthermore, the controller 112 may store any information and/or data received from the elements within, or external to, the device 100. Accordingly, the controller 112 may facilitate the communication of information and/or data from an element within the device 100 to an element external to the device, and vice versa.

In an aspect, the controller 112 eliminates the need for external sensors to gather information from the device 100 (e.g., when thrown by the user). Instead, the information is gathered within the device 100, and then either processed within the device or sent over a network to be processed elsewhere. In an aspect, the information may be integrated within a larger ecosystem (e.g., server and/or client-facing mobile application) to drive gamification and interactivity. This allows for information related to events occurring within the theme park to be utilized and/or persist outside of the theme park.

Figure 2A:
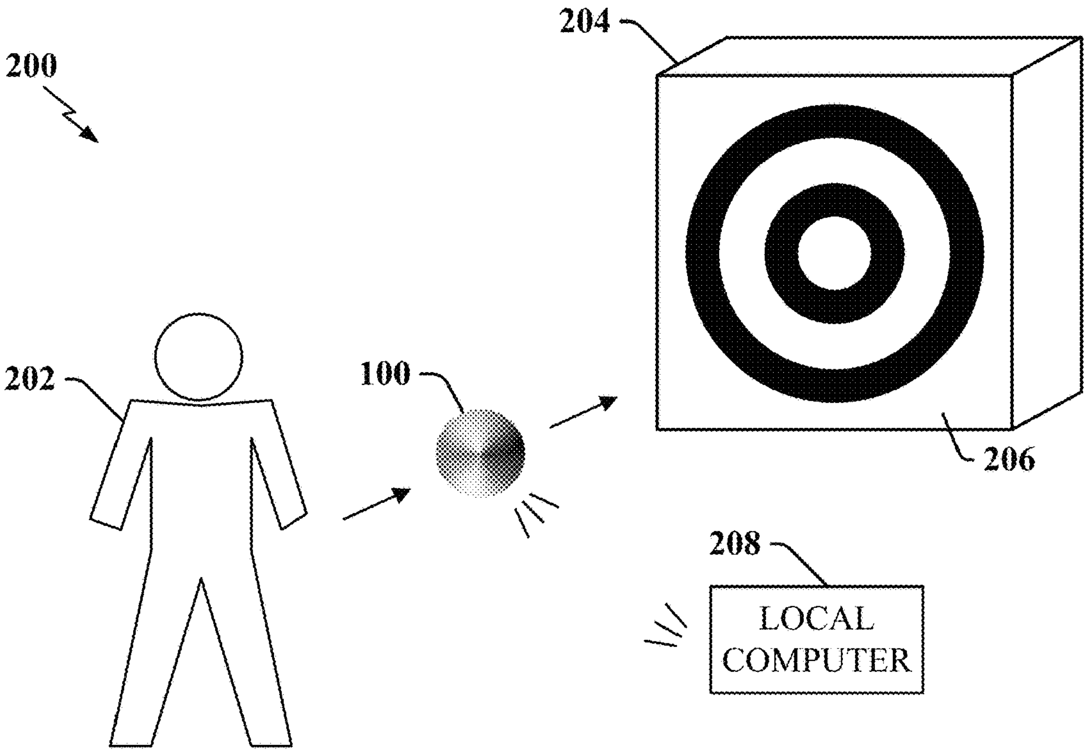
FIG. 2A illustrates a view of an example implementation of the device according to an aspect of the present disclosure.
Figure 2B:
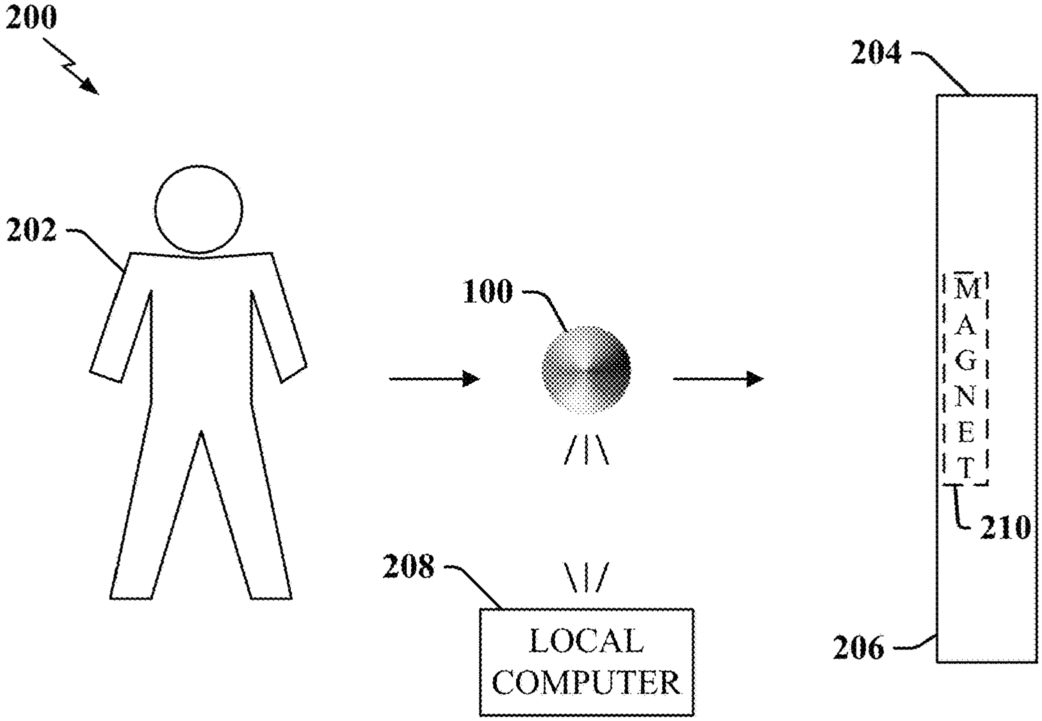
FIG. 2B illustrates an alternate view of the example implementation according to an aspect of the present disclosure.

FIG. 2A illustrates a view of an example implementation 200 of the device 100 according to an aspect of the present disclosure. FIG. 2B illustrates an alternate view of the example implementation 200 according to an aspect of the present disclosure. In the example implementation 200, a user 202 (e.g., theme park guest) may participate in an attraction where the objective is to throw the device 100 toward a target 204. When the device 100 leaves the user's hand (or other body part), an IMU sensor suite (e.g., gyrometer 106, accelerometer 108, and magnetometer 110) housed within the device 100 may sense various information related to the device, such as a speed, a rotation, and/or a proximity of the device to the target 204 based on how the device is thrown. The sensed information may then be wirelessly transmitted from the device 100 to a local computer 208 for further processing.

In an aspect, as the user 202 throws the device 100 toward the target 208, the gyrometer 106 may measure an angular velocity (or change in rotation angle per unit of time) of the device 100. The accelerometer 108 may measure an acceleration (or change in speed) of the device 100. For example, if the accelerometer 108 detects a large increase in acceleration of the device 100, this may indicate a point in time where the user 100 starts throwing the device 100. If the accelerometer 108 detects a large decrease in acceleration of the device 100, this may indicate a point in time where the device 100 stops traveling toward the target 108. Moreover, a magnet 210 may be located at or near the front surface 206 of the target 204. Thus, the magnetometer 110 may also measure a strength of a magnetic field of the magnet 210 as the device 100 nears the front surface 206. In an example, the measured strength of the magnetic field may be indicative of how accurate the user's throw of the device 100 is to the center (e.g., bullseye) of the target 204. Thus, a high measured strength of the magnetic field may indicate that the device throw is near the center of the target 204 and a low measured strength of the magnetic field may indicate that the device throw is far from the center of the target 204.

In an aspect, the local computer 208 may be in communication with a theme park attraction configured to activate a show element or effect (e.g., light show, sound effect, shooting water show, etc.) based on how the device 100 is thrown by the user with respect to the front surface 206 of the target 204. Upon the device 100 being thrown, the device 100 may wirelessly forward the measured angular velocity, the measured acceleration, and/or the measured strength of the magnetic field to the local computer 208. The local computer 208 may receive the measured information and send a signal to the theme park attraction to activate the show element or effect if one or more of the measured angular velocity, acceleration, or magnetic field strength reaches or exceeds a threshold set to trigger the show element or effect. For example, an accurate device throw (e.g., throw has high magnetic field strength) may cause the local computer 208 to send a signal to the theme park attraction to activate an effect, such as a light show or shooting water show. In another example, if the device throw is accurate and fast (e.g., throw has high magnetic field strength and high acceleration), then the local computer 208 may send a signal to the theme park attraction to activate the effect at a larger scale, such as a higher intensity light show or higher intensity shooting water show. In a further example, if the device throw is inaccurate (e.g., throw has low magnetic field strength), then the local computer 208 may send a signal to the theme park attraction to perform no action or activate an effect indicating a negative outcome (e.g., play buzzing sound and/or release white puff of smoke).

In an aspect, the local computer 208 may run a game where the user 202 is rewarded based on how the device 100 is thrown with respect to the front surface 206 of the target 204. Upon the device 100 being thrown, the device 100 may wirelessly forward the measured angular velocity, the measured acceleration, and/or the measured strength of the magnetic field to the local computer 208 running the game. As such, the local computer 208 may facilitate analysis of the measured information and provide the user with a game prize if one or more of the measured angular velocity, acceleration, or magnetic field strength reaches or exceeds a threshold set to achieve the prize. Different types of device throws may earn different types of prizes. For example, a slow (e.g., low acceleration) and accurate (e.g., high magnetic field strength) device throw may correspond to receiving a first prize type. In another example, a fast (e.g., high acceleration) and accurate (e.g., high magnetic field strength) device throw may correspond to receiving a second prize type. In a further example, a fast and accurate device throw that also has a curved trajectory (e.g., high angular velocity) may correspond to receiving a third prize type. In a final example, an inaccurate device throw may correspond to receiving no prize at all.

The game reward may be associated with the device 100 via the ID tag 104 and stored in a system database in communication with the local computer 208. Data related to the game reward (e.g., reward name, type, identification number, etc.) may also be transmitted from the local computer 208 to the device 100 and stored in a memory or other data storage of the device 100 (e.g., within the controller 112).

Figure 3:
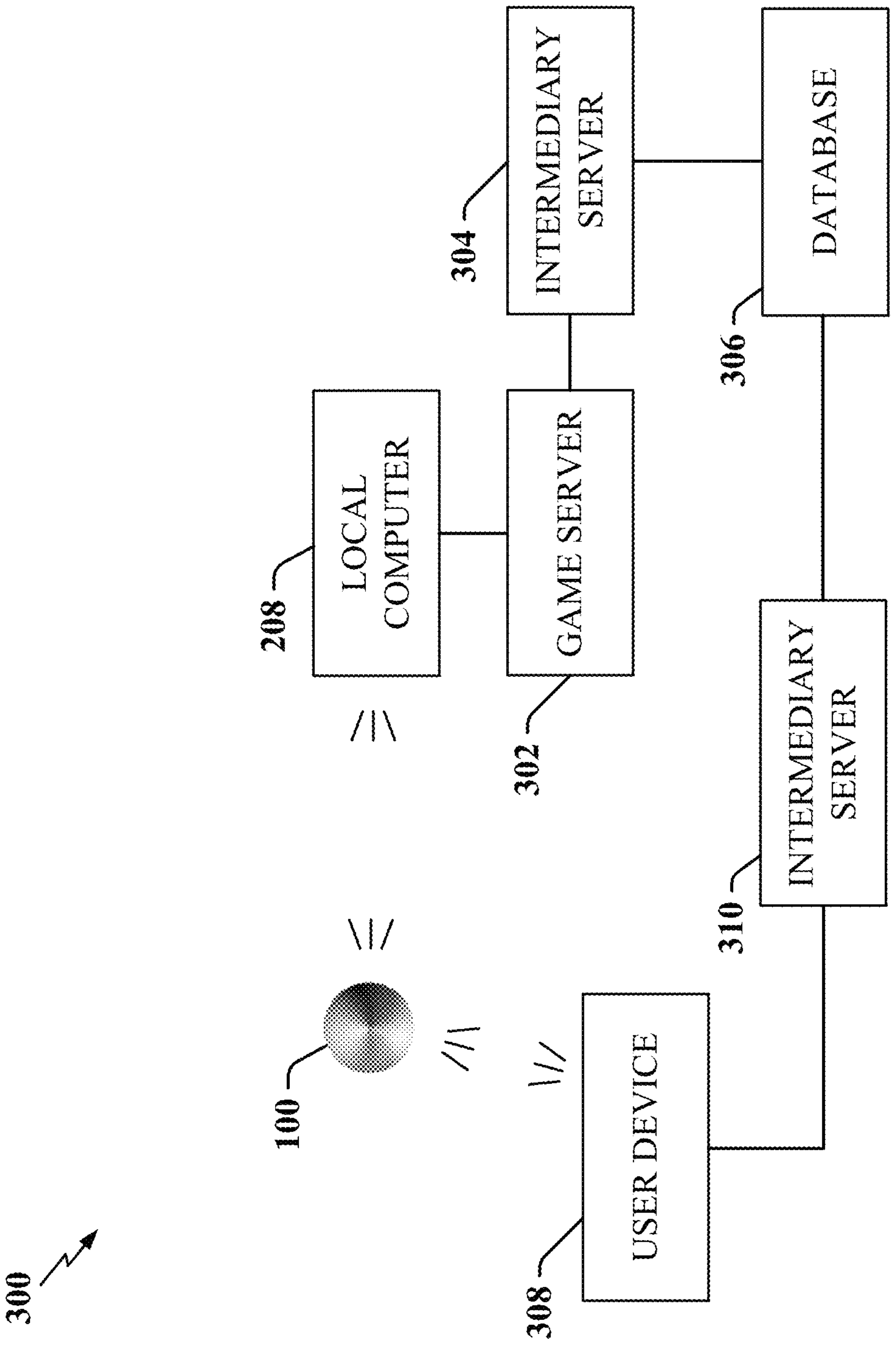
FIG. 3 illustrates an example system for implementing the device in a game environment according to an aspect of the present disclosure.

FIG. 3 illustrates an example system 300 for implementing the device 100 in a game environment according to an aspect of the present disclosure. The system 300 may include the device 100, the local computer 208, a game server 302, an intermediary server 304, and a database 306. As stated above, the local computer 208 may run a game where the user 202 is rewarded based on how the device 100 is thrown with respect to the front surface 206 of the target 204. The local computer 208 may be in communication (wired or wireless communication) with the game server 302 configured to render prizes for the user 202 in association with the device 100. The game server 302 may operate as a central manager/controller for the game being run on the local computer 208. Accordingly, when the device 100 is thrown by the user 202, the controller 112 of the device 100 may wirelessly forward, via the antenna/transceiver 114, measured information (e.g., angular velocity, acceleration, and/or magnetic field strength) as well as device information (e.g., ID tag 104) to the local computer 208. For example, the information sent from the device 100 to the local computer 208 may be in JavaScript Object Notation (JSON) format. The local computer 208 may then send the measured information and the device information to the game server 302 for analysis. The game server 302 may analyze the measured information to determine a speed and accuracy of the device throw and reward the user 202 accordingly. For example, based on the measured information, the game server 302 may determine that the device throw is slow (e.g., low acceleration) and accurate (e.g., high magnetic field strength). Accordingly, the game server 302 may reward the user 202 with a prize corresponding to the slow and accurate throw (e.g., first prize type). In another example, based on the measured information, the game server 302 may determine that the device throw is slow and inaccurate (e.g., low magnetic field strength), and therefore, forgo rewarding any prize to the user 302 corresponding to the slow and inaccurate throw.

In an aspect, upon the game server 302 rewarding the user 202 with the prize, the game server 302 may forward data related to the prize (e.g., image, prize name, type, identification number, etc.) to the local computer 208. The local computer 208 may then display an image (and/or other information) or play a sound related to the prize to allow the user 202 to visualize or hear the earned reward. The local computer 203 may further send the data related to the prize to the device 100, which may then store the data in a memory or other data storage of the device 100 (e.g., within the controller 112).

In an aspect, the game server 302 may associate the rewarded prize with the device 100 via the ID tag 104. The game server 302 may further store the association between the ID tag 104 and the rewarded prize in an account specific to the user 202 in the database 306. In an aspect, the intermediary server 304 facilitates communication between the game server 302 and the database 306. For example, the intermediary server 304 may receive the data from the game server 302 and translate (e.g., decode) the data into a form that is writeable into the database 306.

In an aspect, the example system 300 may further include a user device 308 (e.g., home computer, smartphone, tablet device, etc.). In an aspect, an application running on the user device 308 may be configured to access the data stored in the database 306. Accordingly, after the game server 302 rewards the user 202 with the prize and associates the rewarded prize to the ID tag 104, the user may utilize the user device 308 (e.g., smartphone) to query the database 306 to recall and/or utilize the one or more prizes rewarded to the user. For example, the user 202 may enter or scan the ID tag 104 of the device 100 into the user device 308, and the application running on the user device 308 may query the database 306 for the one or more prizes corresponding to the ID tag 104. In an aspect, a second intermediary server 310 facilitates communication between the user device 308 and the database 306. For example, the second intermediary server 304 may receive the data from the database 306 and translate (e.g., decode) the data into a form that is readable by the application running on the user device 308. Upon receiving prize data related to the one or more prizes from the database 306, the application may display the prize data on a screen of the user device 308 to be viewed by the user. Additionally, or alternatively, if the application is a game running on the user device 308, the user may select any of the one more prizes (e.g., first prize type) corresponding to the ID tag 104 for use in the game.

In an aspect, a user (e.g., theme park guest) participating in an interactive theme park attraction may throw the device 100 in an attempt to win a prize (e.g., a prize associated with a game running on local computer 208/game server 302). Based on how the device 100 is thrown, the user may be rewarded with different types of prizes (e.g., first prize type, second prize type, etc.). If the device 100 is thrown poorly (e.g., device throw is slow and inaccurate), the user may not be rewarded a prize at all. Information related to rewarded prizes (or prize data) may be associated with the user via the ID tag 104 of the device 100 and stored in the database 306. Accordingly, once the user leaves the theme park, all prize data accumulated via the device 100 remains associated with the ID tag 104. In an aspect, if the user later connects the device 100 to the user device 308 (e.g., home computer, smartphone, tablet device, etc.) running an application (e.g., game) that utilizes the accumulated prizes, the user may access all of the prizes stored in the database 306 associated with the ID tag 104 and bring the prizes into the user device 308 for use by the application. Communications between the game server 302 and the database 306 may occur to ensure that prizes accumulated by users are retained by the users, and the users are able to access the prizes and bring the prizes into applications running on user devices.

Figure 4:
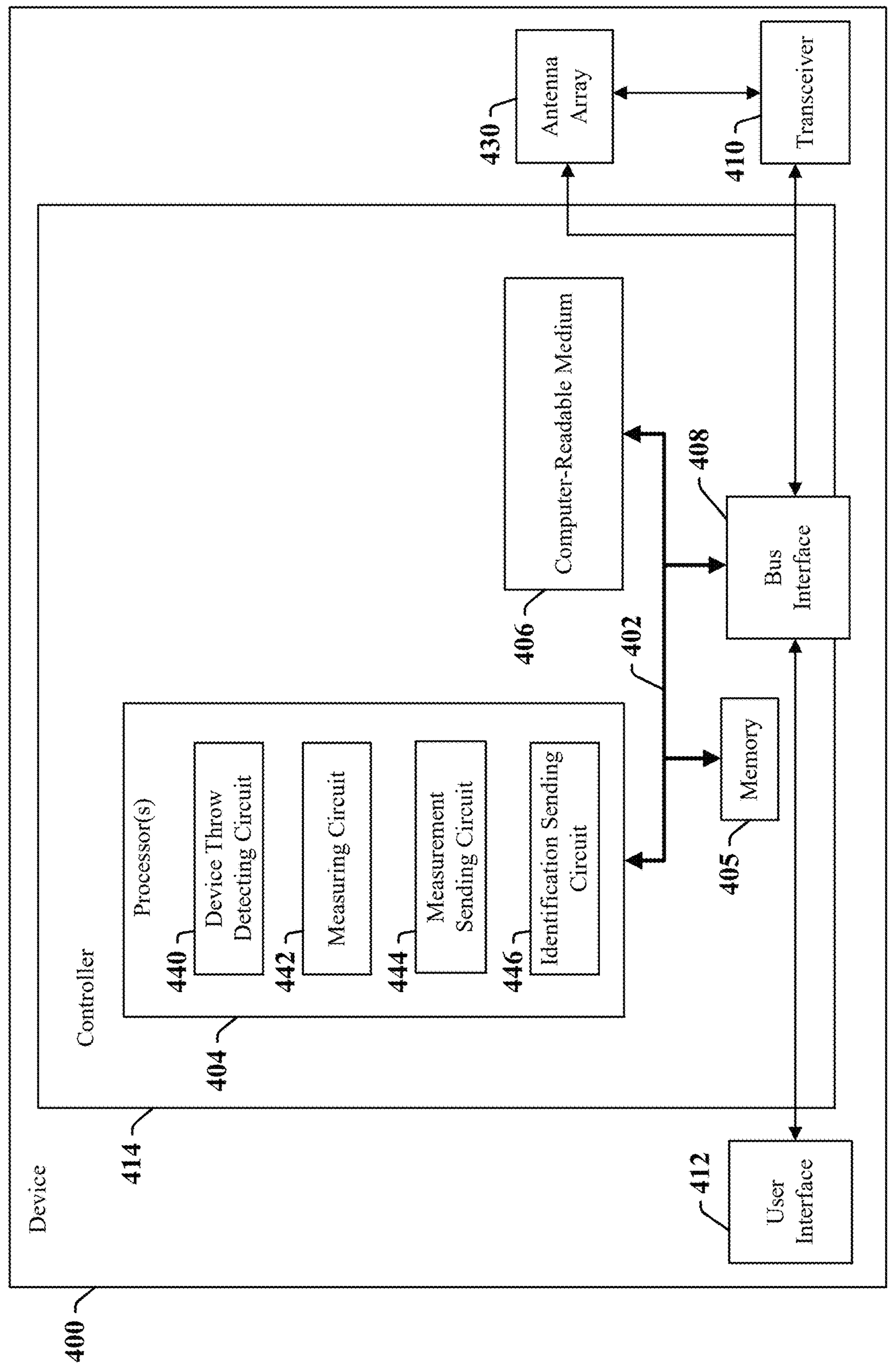
FIG. 4 is a block diagram illustrating an example of a hardware implementation for an exemplary device employing a controller for triggering an action when the device is separated from a user according to an aspect of the present disclosure.

FIG. 4 is a block diagram illustrating an example of a hardware implementation for an exemplary device 400 employing a controller 414. For example, the device 400 may be an electronic device for triggering an action when separated from a user and capable of communicating with and/or controlling other electronic devices. Moreover, the controller 414 may be the controller 112 shown in FIG. 1. The controller 414 includes one or more processors 404. Examples of processors 404 include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. In various examples, the device 400 may be configured to perform any one or more of the functions described herein. That is, the processor 404, as utilized in a device 400, may be used to implement any one or more of the processes and procedures described and illustrated in FIG. 5.

In this example, the controller 414 may be implemented with a bus architecture, represented generally by a bus 402. The bus 402 may include any number of interconnecting buses and bridges depending on the specific application of the processing system 414 and the overall design constraints. The bus 402 communicatively couples together various circuits including one or more processors (represented generally by the processor 404), a memory 405, and computer-readable media (represented generally by the computer-readable medium 406). The bus 402 may also link various other circuits such as timing sources, peripherals, voltage regulators, and power management circuits, which are well known in the art, and therefore, will not be described any further. A bus interface 408 provides an interface between the bus 402 and one or more transceivers 410. The one or more transceivers 410 provides a communication interface or means for communicating with various other apparatus over a transmission medium (e.g., via a wired connection or a wireless connection using an antenna array 430). For example, the one or more transceivers 410 may provide a communication interface between the controller 414 and the local computer 208 and/or the user device 308. Depending upon the nature of the device, a user interface 412 (e.g., keypad, display, speaker, microphone, joystick) may also be provided. Of course, such a user interface 412 is optional, and may be omitted in some examples.

In some aspects of the disclosure, the processor 404 may include device throw detecting circuitry 440 configured for various functions, including, for example, detecting a start of a device throw toward a target, wherein the device is separated from a user during the device throw and detecting an end of the device throw. For example, the device throw detecting circuitry 440 may be configured to implement one or more of the functions described below in relation to FIG. 5, including, e.g., blocks 502 and 510. The processor 404 may also include measuring circuitry 442 configured for various functions, including, for example, measuring at least one of a magnetic field strength, an acceleration of the device, or an angular velocity of the device during the device throw and ceasing measurement of the at least one of the magnetic field strength, the acceleration, or the angular velocity when the end of the device throw is detected. For example, the measuring circuitry 442 may be configured to implement one or more of the functions described below in relation to FIG. 5, including, e.g., blocks 506 and 512. The processor 404 may also include measurement sending circuitry 444 configured for various functions, including, for example, sending the at least one of the measured magnetic field strength, the measured acceleration, or the measured angular velocity to a second device during the device throw to trigger an action via the second device. For example, the measurement sending circuitry 444 may be configured to implement one or more of the functions described below in relation to FIG. 5, including, e.g., block 508. The processor 404 may also include identification sending circuitry 446 configured for various functions, including, for example, sending a device identification to the second device. For example, the identification sending circuitry 446 may be configured to implement one or more of the functions described below in relation to FIG. 5, including block 502.

The processor 404 is responsible for managing the bus 402 and general processing, including the execution of software stored on the computer-readable medium 406. The software, when executed by the processor 404, causes the controller 414 to perform the various functions described below for any particular apparatus. The computer-readable medium 406 and the memory 405 may also be used for storing data that is manipulated by the processor 404 when executing software.

One or more processors 404 in the controller may execute software. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise. The software may reside on a computer-readable medium 406. The computer-readable medium 406 may be a non-transitory computer-readable medium. A non-transitory computer-readable medium includes, by way of example, a magnetic storage device (e.g., hard disk, floppy disk, magnetic strip), an optical disk (e.g., a compact disc (CD) or a digital versatile disc (DVD)), a smart card, a flash memory device (e.g., a card, a stick, or a key drive), a random access memory (RAM), a read only memory (ROM), a programmable ROM (PROM), an erasable PROM (EPROM), an electrically erasable PROM (EEPROM), a register, a removable disk, and any other suitable medium for storing software and/or instructions that may be accessed and read by a computer. The computer-readable medium 406 may reside in the controller 414, external to the controller 414, or distributed across multiple entities including the controller 414. The computer-readable medium 406 may be embodied in a computer program product. By way of example, a computer program product may include a computer-readable medium in packaging materials. Those skilled in the art will recognize how best to implement the described functionality presented throughout this disclosure depending on the particular application and the overall design constraints imposed on the overall system.

Figure 5:
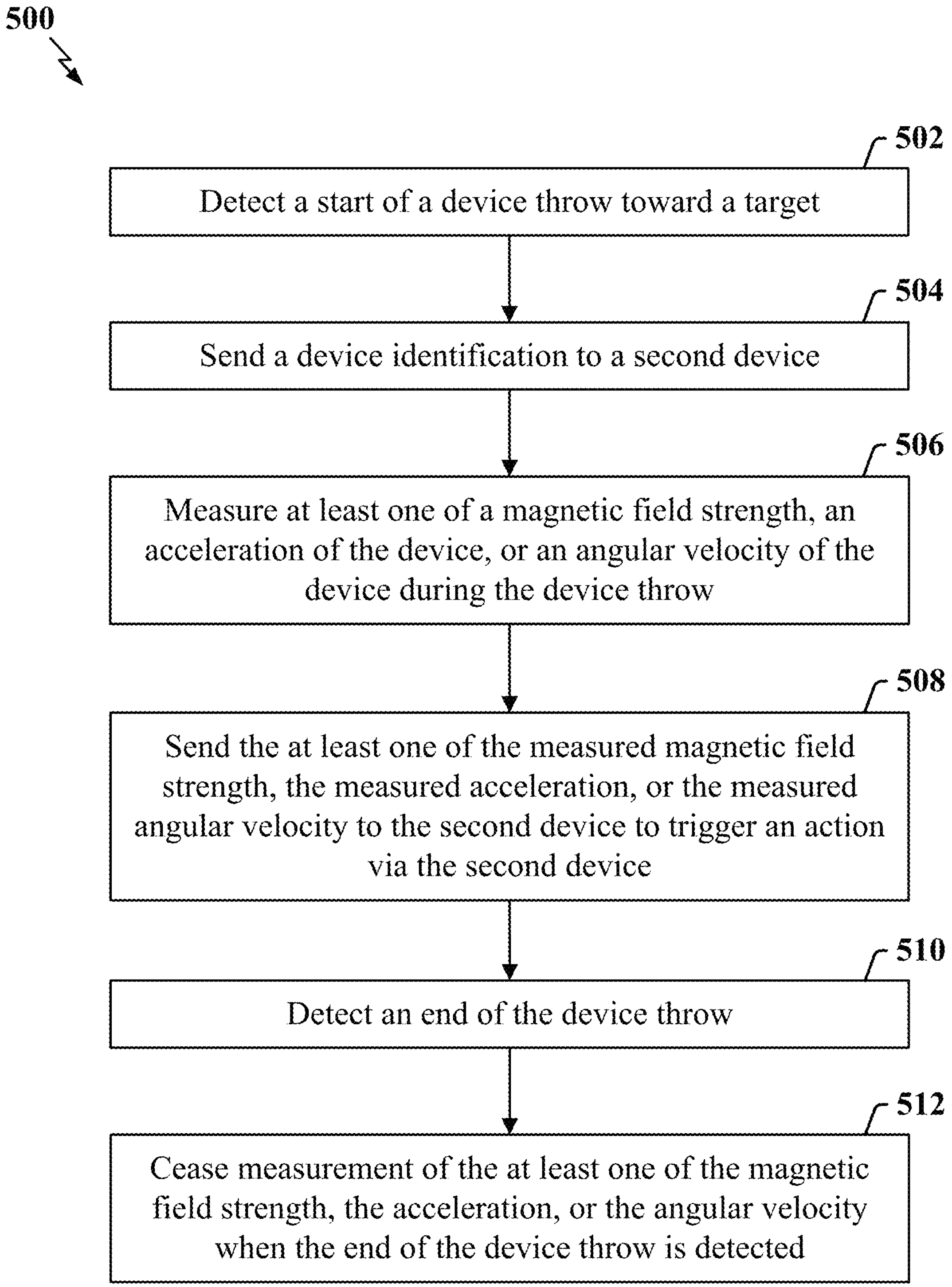
FIG. 5 is a flow chart illustrating an exemplary process for a device for triggering an action when separated from a user according to an aspect of the present disclosure.

FIG. 5 is a flow chart illustrating an exemplary process 600 for a device for triggering an action when separated from a user according to an aspect of the present disclosure. The process 600 measures information related to a movement and/or spatial position of the device while the device is thrown toward the target. The process 600 may be performed by a processor of the device (e.g., controller 112 or controller 414). In an aspect, the device may be thrown by the user toward the target (e.g., target 204) as part of a game or to trigger a show element, effect, or event of an interactive theme park attraction.

At block 502, the process detects a start of a device throw toward a target, wherein the device is separated from a user during the device throw. For example, if the process detects (e.g., via accelerometer 108) a large increase in acceleration of the device, the process may determine the event as the start of the device throw (e.g., device starts traveling toward the target).

At block 504, the process sends (e.g., via antenna/transceiver 114) a device identification (e.g., ID tag 104) to a second device (e.g., local computer 208).

At block 506, the process measures at least one of a magnetic field strength, an acceleration, or an angular velocity of the device during the device throw (i.e., while the device is traveling toward the target). In an aspect, the device may include a gyrometer (e.g., gyrometer 106) configured to measure an angular velocity of the device, an accelerometer (e.g., accelerometer 108) configured to measure an acceleration of the device, and a magnetometer (e.g., magnetometer 110) configured to measure the magnetic field strength of a magnet located at the target.

At block 508, the process sends (e.g., via antenna/transceiver 114) the at least one of the measured magnetic field strength, the measured acceleration, or the measured angular velocity to the second device during the device throw to trigger an action via the second device. In an aspect, the second device may be running a game involving the user throwing the device toward the target. As such, the action triggered via the second device may be the rewarding of a prize or prizes (e.g., first prize type, second prize type, etc.) based on the at least one of the measured magnetic field strength, the measured acceleration, or the measured angular velocity. Additionally or alternatively, the second device may be coupled to an interactive theme park attraction. Accordingly, the action triggered via the second device may be a show element, effect, or event (e.g., light show, sound effect, shooting water show, etc.) based on the at least one of the measured magnetic field strength, the measured acceleration, or the measured angular velocity.

A block 510, the process detects an end of the device throw. For example, if the process (e.g., via accelerometer 108) detects a large decrease in acceleration of the device, the process may determine the event as the end of the device throw (e.g., device stops traveling toward the target).

At block 512, the process ceases measurement of the at least one of the magnetic field strength, the acceleration, or the angular velocity when the end of the device throw is detected.

Figure 6:
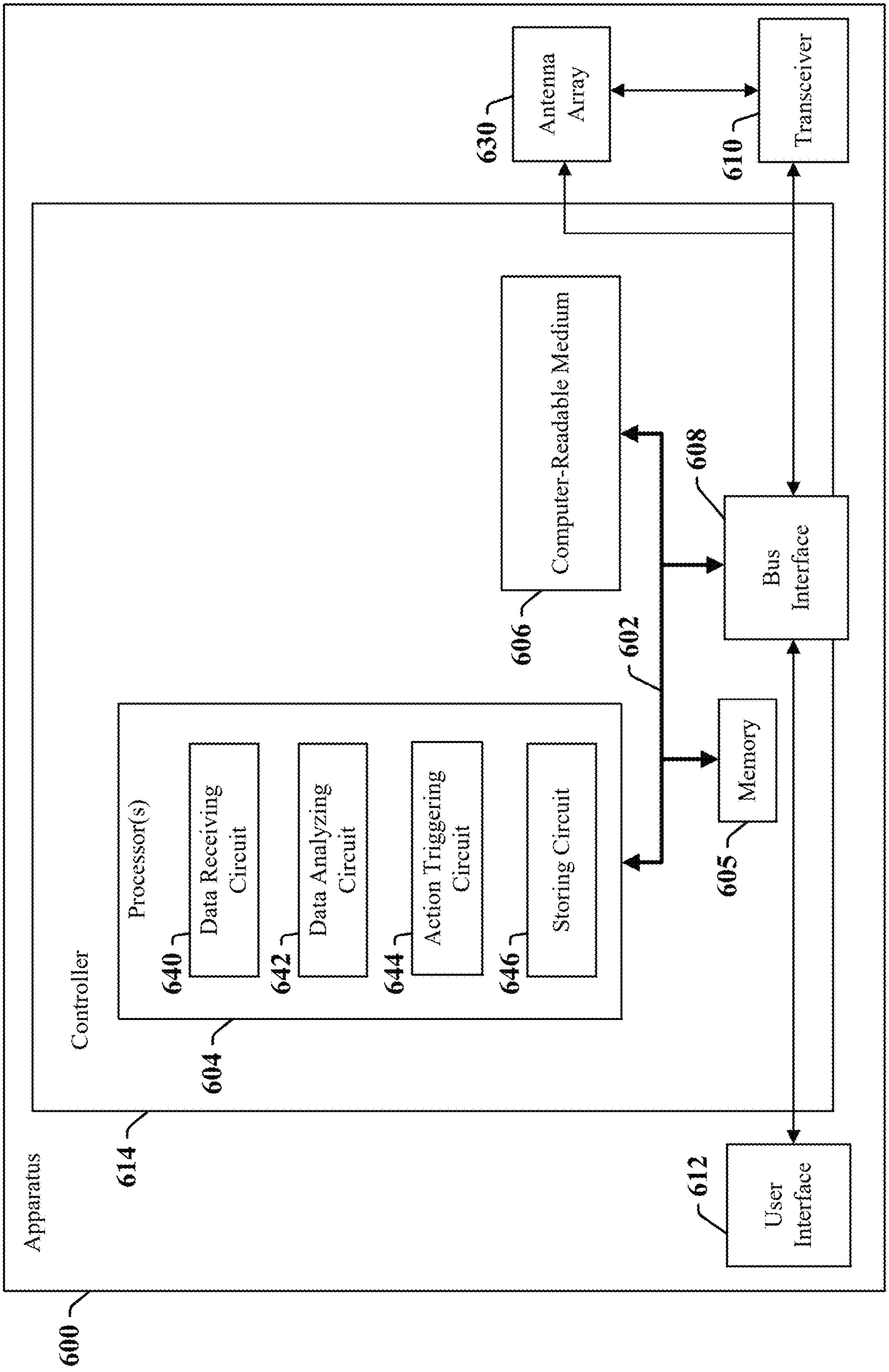
FIG. 6 is a block diagram illustrating an example of a hardware implementation for an exemplary apparatus employing a controller for triggering an action based on throw data received from a throwable device while the throwable device is separated from a user according to an aspect of the present disclosure.

FIG. 6 is a block diagram illustrating an example of a hardware implementation for an exemplary apparatus 600 employing a controller 614 for triggering an action based on throw data received from a throwable device (e.g., device 100) while the throwable device is separated from a user. For example, the apparatus 600 may be an electronic apparatus (e.g., game server 302) in communication with a computer (e.g., local computer 208) running/monitoring a game involving the throwable device (e.g., device 100) being thrown at a target (e.g., target 204). The apparatus 600 is capable of communicating with and/or controlling other electronic devices. The controller 614 includes one or more processors 604. Examples of processors 604 include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. The controller 614 may be substantially the same as the controller 414 illustrated in FIG. 4, including a bus interface 608, a bus 602, memory 605, a processor 604, and a computer-readable medium 606. Furthermore, the apparatus 600 may include a user interface 612, one or more transceivers 610, and an antenna array 630 substantially similar to those described above in FIG. 4. In various examples, the apparatus 600 may be configured to perform any one or more of the functions described herein. That is, the processor 604, as utilized in an apparatus 600, may be used to implement any one or more of the processes and procedures described and illustrated in FIG. 7.

In some aspects of the disclosure, the processor 604 may include data receiving circuitry 640 configured for various functions, including, for example, receiving throw data from a device while the device is separated from a user and traveling toward a target, wherein the throw data comprises at least one of a magnetic field strength, an acceleration of the device, or an angular velocity of the device as measured by the device and a device identification. For example, the data receiving circuitry 640 may be configured to implement one or more of the functions described below in relation to FIG. 7, including, e.g., block 702. The processor 604 may also include data analyzing circuitry 642 configured for various functions, including, for example, analyzing the throw data, which may include determining whether the measured magnetic field strength is greater than or equal to a threshold and reading the measured magnetic field strength in combination with at least one of the measured acceleration or the measured angular velocity when the measured magnetic field strength is greater than or equal to the threshold. For example, the data analyzing circuitry 642 may be configured to implement one or more of the functions described below in relation to FIG. 7, including, e.g., blocks 704 and 708. The processor 604 may also include action triggering circuitry 644 configured for various functions, including, for example, determining whether to trigger the action based on the analyzed throw data, which may include forgoing to trigger the action when the measured magnetic field strength is less than the threshold and triggering the action (e.g., rewarding a prize) based on the measured magnetic field strength in combination with the at least one of the measured acceleration or the measured angular velocity. For example, the action triggering circuitry 644 may be configured to implement one or more of the functions described below in relation to FIG. 7, including, e.g., blocks 706 and 710. The processor 604 may also include storing circuitry 646 configured for various functions, including, for example, associating the prize with the device identification, and storing the device identification and the associated prize in a database. For example, the storing circuitry 646 may be configured to implement one or more of the functions described below in relation to FIG. 7, including blocks 712 and 714.

Figure 7:
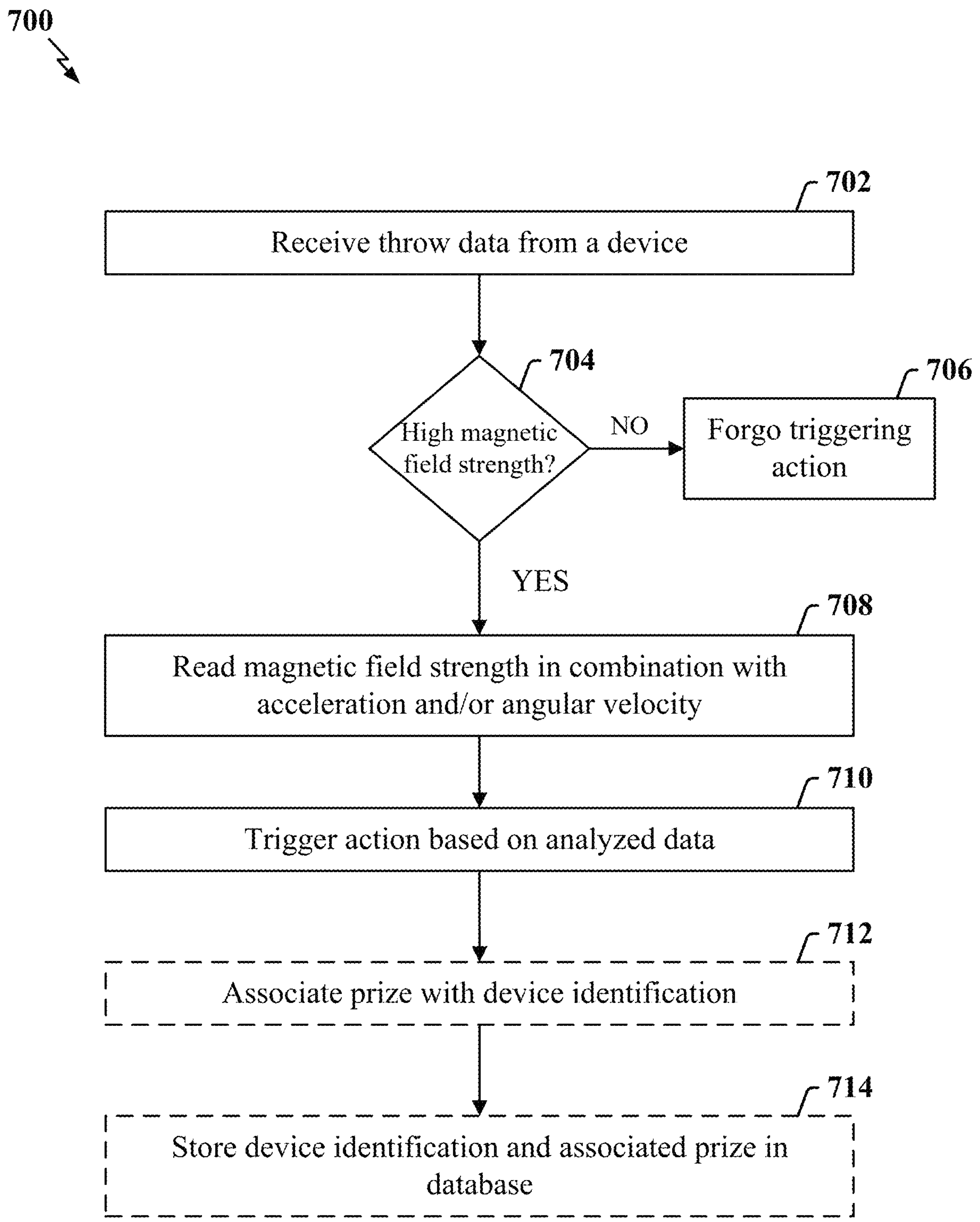
FIG. 7 is a flow chart illustrating an exemplary process for an apparatus for triggering an action based on throw data received from a device while the device is separated from a user according to an aspect of the present disclosure.

FIG. 7 is a flow chart illustrating an exemplary process 700 for an apparatus (e.g., game server 302) for triggering an action based on throw data received from a device (e.g., device 100) while the device is separated from a user according to an aspect of the present disclosure. The process 700 may be performed by a processor of the apparatus (e.g., controller 614). In an aspect, the apparatus controls a computer (e.g., local computer 208) running/monitoring a game where a user of the device is rewarded based on how the device is thrown with respect to the target. In another aspect, the apparatus may be configured to trigger a show element, effect, or event of an interactive theme park attraction based on how the device is thrown with respect to the target.

At block 702, the process receives throw data from a device (e.g., device 100) while the device is separated from a user and traveling toward a target (e.g., target 204). The throw data includes a magnetic field strength, an acceleration of the device, and/or an angular velocity of the device as measured by the device as the device is thrown by a user (e.g., user 202) toward the target. The throw data may further include a device identification (e.g., ID tag 104). In an aspect, the throw data may be received directly from the device or via a computer (e.g., local computer 208) that communicates with the device.

In an aspect, the angular velocity of the device is measured by a gyrometer of the device (e.g., gyrometer 106) including an x-direction value ($X_g$), a y-direction value ($Y_g$), a z-direction value ($Z_g$), and a time value ($T_g$). The acceleration of the device is measured by an accelerometer of the device (e.g., accelerometer 110) including an x-direction value ($X_a$), a y-direction value ($Y_a$), a z-direction value ($Z_a$), and a time value ($T_a$). The magnetic field strength data is measured by a magnetometer of the device (e.g., magnetometer 110) including an x-direction value ($X_m$), a y-direction value ($Y_m$), a z-direction value ($Z_m$), and a time value ($T_m$).

At block 704, the process analyzes the throw data. For example, analyzing the throw data includes determining whether the measured magnetic field strength is greater than or equal to a threshold. In an aspect, the process analyzes the measured magnetic field strength data ($X_m$, $Y_m$, $Z_m$, and $T_m$) and determines whether a measured magnetic field strength is high enough to register a hit on the target (e.g., target 204). For example, the measured magnetic field strength may be compared to a predetermined magnetic field strength threshold indicating whether the device hits the target. Accordingly, if the measured magnetic field strength is less than the predetermined magnetic field strength threshold, then the process determines that the device does not hit the target and proceeds to block 706.

At block 706, the process determines to forgo triggering the action when the measured magnetic field strength is less than the threshold. For example, if the apparatus controls the computer (e.g., local computer 208) running/monitoring the game where the user of the device is rewarded based on how the device is thrown with respect to the target, then the process forgoes rewarding the game prize to the user based on the throw data. Optionally, the process may send a signal to the computer to activate an effect indicating a negative outcome (e.g., display "No Prize Won" on a screen or play a buzzing sound). In another example, if the apparatus is configured to trigger a show element, effect, or event of an interactive theme park attraction based on how the device is thrown with respect to the target, then the process may send a signal to the theme park attraction (e.g., via the computer) to perform no action or activate an effect indicating a negative outcome (e.g., play buzzing sound and/or release white puff of smoke).

If the measured magnetic field strength is greater than or equal to the predetermined threshold, then the process determines that the device hits the target and proceeds to block 708. At block 708, the process further analyzes the throw data by reading the measured magnetic field strength in combination with at least one of the measured acceleration or the measured angular velocity when the measured magnetic field strength is greater than or equal to the predetermined threshold. In an aspect, the process analyzes the measured acceleration data ($X_a$, $Y_a$, $Z_a$, and $T_a$) and/or the measured angular velocity data ($X_g$, $Y_g$, $Z_g$, and $T_g$) with the measured magnetic field strength data ($X_m$, $Y_m$, $Z_m$, and $T_m$). The measured acceleration may be compared to a predetermined acceleration threshold indicating whether a device throw is a slow throw or a fast throw. For example, if the measured acceleration is less than the predetermined acceleration threshold, then the process determines that the device throw is a slow throw. If the measured acceleration is greater than or equal to the predetermined acceleration threshold, then the process determines that the device throw is a fast throw. Moreover, the measured angular velocity may be compared to a predetermined angular velocity threshold indicating whether the device throw is a non-curved throw or a curved throw. For example, if the measured angular velocity is less than the predetermined angular velocity threshold, then the process determines that the device throw is a non-curved throw. If the measured angular velocity is greater than or equal to the predetermined angular velocity threshold, then the process determines that the device throw is a curved throw.

At block 710, the process triggers the action based on the analyzed data (e.g., the measured magnetic field strength in combination with the at least one of the measured acceleration or the measured angular velocity). For example, if the apparatus controls the computer (e.g., local computer 208) running/monitoring the game where the user of the device is rewarded based on how the device is thrown with respect to the target, then the process triggers the action by rewarding the game prize to the user based on the measured magnetic field strength in combination with the at least one of the measured acceleration or the measured angular velocity. In an aspect, the process may reward different types of prizes based on different combinations of the measured magnetic strength, the measured acceleration, and the measured angular velocity. For example, if the device throw is determined to have high magnetic field strength (e.g., device hits target) and low acceleration (e.g., slow throw), then the process may reward a first prize type to the user. If the device throw is determined to have high magnetic field strength (e.g., device hits target) and high acceleration (e.g., fast throw), then the process may reward a second prize type to the user. If the device throw is determined to have high magnetic field strength (e.g., device hits target), high acceleration (e.g., fast throw), and high angular velocity (e.g., curved throw), then the process may reward a third prize type to the user. In another example, if the apparatus is configured to trigger the show element, effect, or event of the interactive theme park attraction based on how the device is thrown with respect to the target, then the process may trigger the action by sending a signal to the theme park attraction (e.g., via the computer) to activate the show element, effect, or event (e.g., light show, sound effect, shooting water show, etc.) based on the analyzed data.

Optionally, at block 712, the process associates the prize with the device identification (e.g., ID tag 104). At block 714, the process stores the device identification and the associated prize in a database (e.g., database 306). In an aspect, the database may be accessed by the user (e.g., via a home computer, smartphone, tablet device, or any other suitable device controlled by the user) to recall the rewarded game prize associated with the device via the device identification.

Referring to FIGS. 1-7, a system for triggering an action via a device separated from a user according to an aspect of the present disclosure will now be described. The system includes a device (e.g., device 100 or device 400) that may be thrown by a user toward a target and a triggering apparatus (e.g., local computer 208/game server 302 or apparatus 600) that may trigger an action based on data received from the device while the device is traveling toward the target. The device is configured to measure a magnetic field strength (e.g., $X_m$, $Y_m$, $Z_m$, and $T_m$), an acceleration of the device (e.g., $X_a$, $Y_a$, $Z_a$, and $T_a$), and/or an angular velocity of the device (e.g., $X_g$, $Y_g$, $Z_g$, and $T_g$) while the device is separated from the user and traveling toward the target. The device is further configured to send the measured magnetic field strength, the measured acceleration, or the measured angular velocity to the triggering apparatus while the device is separated from the user and traveling toward the target.

In an aspect, the device includes a gyrometer, an accelerometer, and/or a magnetometer. The gyrometer is configured to measure the angular velocity of the device while the device travels toward the target. The accelerometer is configured to measure the acceleration of the device while the device travels toward the target. The magnetometer is configured to measure the magnetic field strength of a magnet located at the target.

The triggering apparatus is configured to receive the measured magnetic field strength, the measured acceleration, and/or the measured angular velocity from the device. The triggering apparatus is further configured to determine whether to trigger an action based on an analysis of the at least one of the measured magnetic field strength, the measured acceleration, or the measured angular velocity.

In an aspect, when determining whether to trigger the action, the triggering apparatus determines whether the measured magnetic field strength is greater than or equal to a threshold. If the measured magnetic field strength is less than the threshold, the triggering apparatus forgoes triggering the action. If the measured magnetic field strength is greater than or equal to the threshold, the triggering apparatus reads the measured magnetic field strength in combination with the measured acceleration and/or the measured angular velocity. Accordingly, the triggering apparatus may then trigger the action based on the measured magnetic field strength in combination with the measured acceleration and/or the measured angular velocity.

In an aspect, the triggering apparatus may trigger the action by sending a signal to an interactive theme park attraction to activate a show element, effect, or event (e.g., light show, sound effect, shooting water show, etc.). In another aspect, the triggering apparatus may trigger the action by rewarding a prize associated with a game running on the triggering apparatus based on the measured magnetic field strength in combination with the measured acceleration and/or the measured angular velocity. In a further aspect, the device is configured to send a device identification to the triggering apparatus. Accordingly, the triggering apparatus may be further configured to receive the device identification from the device, associate the prize with the device identification, and store the device identification and the associated prize in a database (e.g., database 306).

Figure 8:
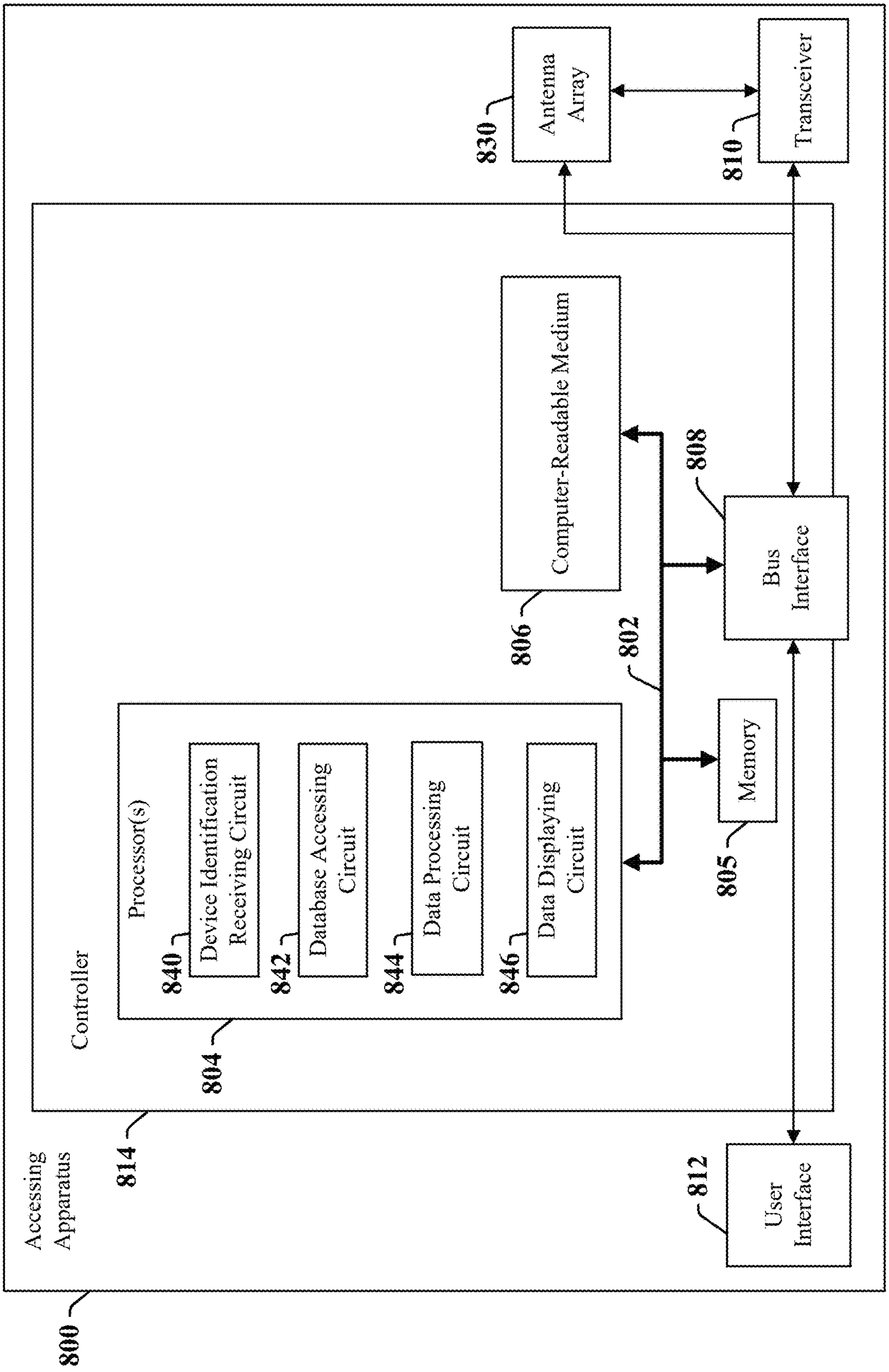
FIG. 8 is a block diagram illustrating an example of a hardware implementation for an exemplary apparatus employing a controller 84 for accessing a database to recall prize data associated with a throwable device according to an aspect of the present disclosure.

FIG. 8 is a block diagram illustrating an example of a hardware implementation for an exemplary apparatus 800 employing a controller 814 for accessing a database to recall prize data associated with a throwable device. For example, the apparatus 800 may be an accessing apparatus (e.g., user device 308) in communication with a database (e.g., database 306) and a throwable device (e.g., device 100) previously thrown at a target (e.g., target 204) as part of a game. The apparatus 800 is capable of communicating with and/or controlling other electronic devices. The controller 814 includes one or more processors 804. Examples of processors 804 include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. The controller 814 may be substantially the same as the controller 414 illustrated in FIG. 4, including a bus interface 808, a bus 802, memory 805, a processor 804, and a computer-readable medium 806. Furthermore, the apparatus 800 may include a user interface 812, one or more transceivers 810, and an antenna array 830 substantially similar to those described above in FIG. 4. In various examples, the apparatus 800 may be configured to perform any one or more of the functions described herein. That is, the processor 804, as utilized in an apparatus 800, may be used to implement any one or more of the processes and procedures described and illustrated in FIG. 9.

In some aspects of the disclosure, the processor 804 may include device identification receiving circuitry 840 configured for various functions, including, for example, receiving a device identification. For example, the device identification receiving circuitry 840 may be configured to implement one or more of the functions described below in relation to FIG. 9, including, e.g., block 902. The processor 804 may also include database accessing circuitry 842 configured for various functions, including, for example, accessing a database to request prize data associated with the device identification. For example, the database accessing circuitry 842 may be configured to implement one or more of the functions described below in relation to FIG. 9, including, e.g., block 904. The processor 404 may also include data processing circuitry 844 configured for various functions, including, for example, receiving the prize data associated with the device identification and selecting the prize data for use in a game running on the apparatus 800. For example, the database processing circuitry 844 may be configured to implement one or more of the functions described below in relation to FIG. 9, including, e.g., blocks 906 and 910. The processor 804 may also include data displaying circuitry 846 configured for various functions, including, for example, displaying the prize data on a display screen (e.g., user interface 812). For example, the database accessing circuitry 846 may be configured to implement one or more of the functions described below in relation to FIG. 9, including block 908.

Figure 9:
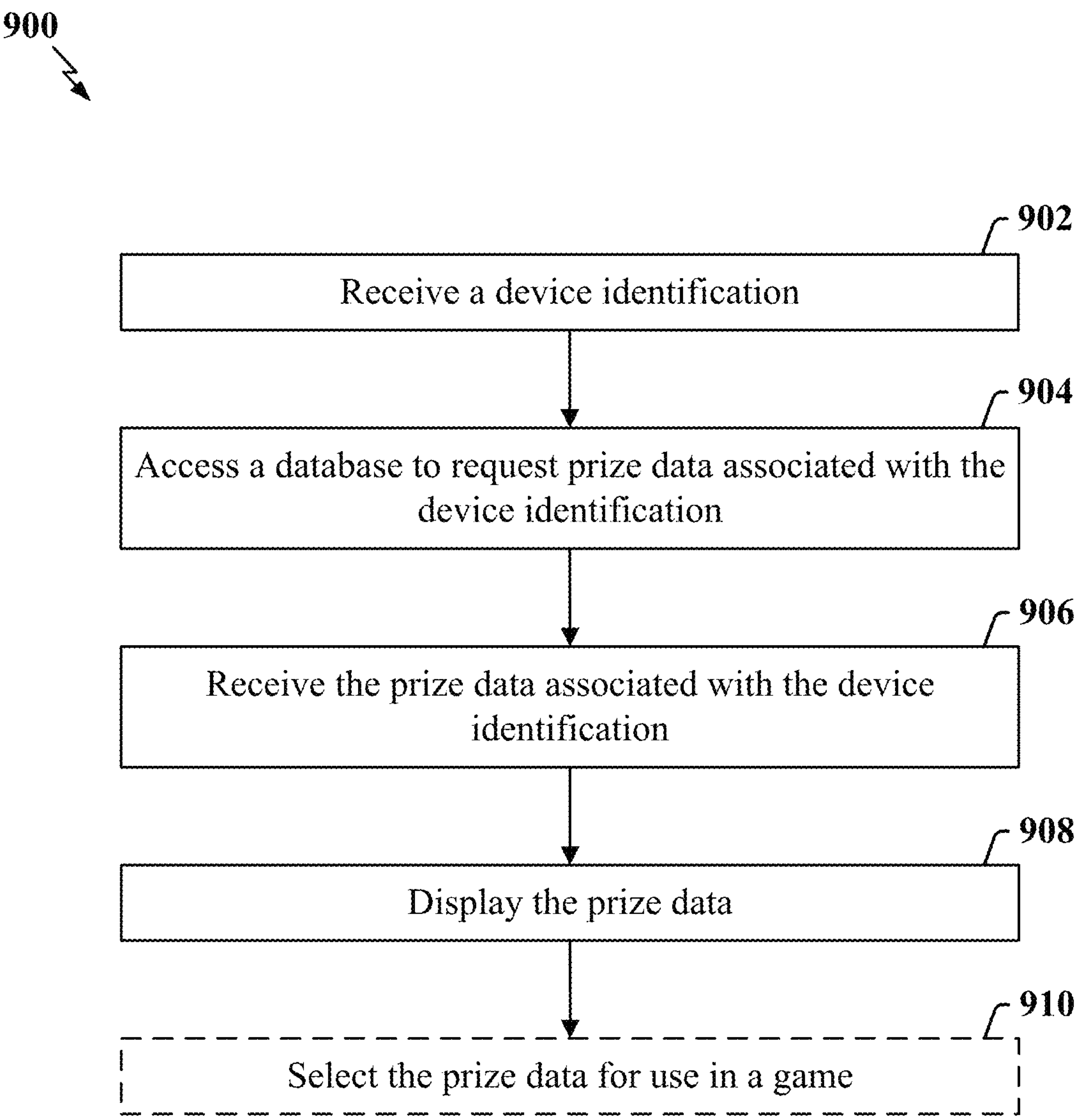
FIG. 9 is a flow chart illustrating an exemplary process for accessing a database to recall prize data associated with a throwable device according to an aspect of the present disclosure.

FIG. 9 is a flow chart illustrating an exemplary process 900 for accessing a database to recall prize data associated with a throwable device (e.g., device 100) according to an aspect of the present disclosure. The process 900 may be performed by a processor of an accessing apparatus or user device (e.g., controller 814). In an aspect, the throwable device may have previously been thrown by a user toward a target (e.g., target 204) as part of a game and one or more prizes may have been rewarded to the user and stored in a database (e.g., database 306) based on how the throwable device was thrown toward the target.

At block 902, the process receives a device identification (e.g., ID tag 104) of the throwable device. For example, a user may manually enter the device identification into the user device. Alternatively, the user may scan the device identification (e.g., ID tag 104) into the user device.

At block 904, the process accesses (e.g., via one or more transceivers 810) the database and requests for any prize data associated with the device identification. The prize data may include, for example, an image, name, type, and/or identification number of one or more prizes previously associated with the device identification.

At block 906, the process receives, from the database (e.g., via one or more transceiver 810), the prize data associated with the device identification. At block 908, the process displays the prize data (e.g., image or name) on a screen (e.g., user interface 812) of the user device. Optionally, at block 910, if the user device is running a game that involves any of the one or more prizes associated with the device identification, the process may select at least one of the one or more prizes for use in the game.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another-even if they do not directly physically touch each other. For instance, a first object may be coupled to a second object even though the first object is never directly physically in contact with the second object.

One or more of the components, steps, features and/or functions illustrated in FIGS. 1-9 may be rearranged and/or combined into a single component, step, feature or function or embodied in several components, steps, or functions. Additional elements, components, steps, and/or functions may also be added without departing from novel features disclosed herein. The apparatus, devices, and/or components illustrated in FIGS. 1-9 may be configured to perform one or more of the methods, features, or steps described herein. The novel algorithms described herein may also be efficiently implemented in software and/or embedded in hardware.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

What is claimed is:

1. A device for triggering an action when separated from a user, the device comprising:
- one or more transceivers;
- one or more sensors; and
- a controller coupled to the one or more transceivers and the one or more sensors, the controller configured to:
  - detect, via the one or more sensors, a start of a device throw toward a target, wherein the device is separated from the user during the device throw,
  - measure, via the one or more sensors, at least a magnetic field strength, an acceleration of the device, or an angular velocity of the device during the device throw, and
  - send, via the one or more transceivers, at least the measured magnetic field strength, the measured acceleration, or the measured angular velocity to a second device during the device throw to trigger an action via the second device, wherein the action triggered via the second device comprises rewarding a prize associated with a game running on the second device based on at least the measured magnetic field strength, the measured acceleration, or the measured angular velocity.

2. The device of claim 1, wherein the controller is further configured to:
- detect, via the one or more sensors, an end of the device throw; and
- cease measurement of at least the magnetic field strength, the acceleration, or the angular velocity when the end of the device throw is detected.

3. The device of claim 1, wherein the controller is further configured to:
- send, via the one or more transceivers, a device identification to the second device.

4. The device of claim 1, wherein the one or more sensors comprises at least:
- a gyrometer configured to measure the angular velocity of the device;

an accelerometer configured to measure the acceleration of the device; or a magnetometer configured to measure the magnetic field strength of a magnet located at the target.

5. The device of claim 1, wherein the action triggered via the second device further comprises:

triggering a show element, effect, or event based on at least the measured magnetic field strength, the measured acceleration, or the measured angular velocity.

6. A method of a device for triggering an action when the device is separated from a user, the method comprising:

detecting, at a device, a start of a device throw toward a target, wherein the device is separated from the user during the device throw;

measuring, at the device, at least a magnetic field strength, an acceleration of the device, or an angular velocity of the device during the device throw; and sending at least the measured magnetic field strength, the measured acceleration, or the measured angular velocity from the device to a second device during the device throw to trigger an action via the second device, wherein the action triggered via the second device comprises rewarding a prize associated with a game running on the second device based on at least the measured magnetic field strength, the measured acceleration, or the measured angular velocity.

7. The method of claim 6, further comprising:

detecting, at the device, an end of the device throw; and ceasing, at the device, measurement of at least the magnetic field strength, the acceleration, or the angular velocity when the end of the device throw is detected.

8. The method of claim 6, further comprising:

sending a device identification from the device to the second device.

9. The method of claim 6, wherein the action triggered via the second device further comprises:

triggering a show element, effect, or event based on at least the measured magnetic field strength, the measured acceleration, or the measured angular velocity.

10. The method of claim 6, wherein the device comprises one or more sensors, and wherein the one or more sensors comprises at least:

a gyrometer configured to measure the angular velocity of the device;

an accelerometer configured to measure the acceleration of the device; or a magnetometer configured to measure the magnetic field strength of a magnet located at the target.

11. An apparatus for triggering an action based on throw data received from a device while the device is separated from a user, the apparatus comprising:

one or more transceivers; and a controller coupled to the one or more transceivers, the controller configured to:

receive, via the one or more transceivers, throw data from a device while the device is separated from the user and traveling toward a target, wherein the throw data comprises at least a magnetic field strength, an acceleration of the device, or an angular velocity of the device as measured by the device, analyze the throw data, and determine whether to trigger the action based on the analyzed throw data, wherein the controller is further configured to analyze the throw data by reading the measured magnetic field strength in combination with at least the measured acceleration or the measured angular velocity when the measured magnetic field strength is greater than or equal to a threshold and trigger the action based on the measured magnetic field strength in combination with at least the measured acceleration or the measured angular velocity.

12. The apparatus of claim 11, wherein the controller is further configured to:

analyze the throw data by determining whether the measured magnetic field strength is greater than or equal to the threshold; and forgo triggering the action when the measured magnetic field strength is less than the threshold.

13. The apparatus of claim 11, wherein the throw data further comprises a device identification, and wherein the controller is further configured to:

trigger the action by rewarding a prize associated with a game running on the apparatus based on the measured magnetic field strength in combination with at least the measured acceleration or the measured angular velocity;

associate the prize with the device identification; and store the device identification and the associated prize in a database.

14. A system for triggering an action via a device separated from a user, the system comprising:

a device configured to:

measure at least a magnetic field strength, an acceleration of the device, or an angular velocity of the device while the device is separated from the user and traveling toward a target, and send at least the measured magnetic field strength, the measured acceleration, or the measured angular velocity to a triggering apparatus while the device is separated from the user and traveling toward the target; and the triggering apparatus configured to:

receive at least the measured magnetic field strength, the measured acceleration, or the measured angular velocity from the device; and determine whether to trigger an action based on an analysis of at least the measured magnetic field strength, the measured acceleration, or the measured angular velocity, wherein determining whether to trigger the action comprises determining whether the measured magnetic field strength is greater than or equal to a threshold.

15. The system of claim 14, wherein the device comprises at least:

a gyrometer configured to measure the angular velocity of the device;

an accelerometer configured to measure the acceleration of the device; or a magnetometer configured to measure the magnetic field strength of a magnet located at the target.

16. The system of claim 14, wherein the triggering apparatus configured to determine whether to trigger the action is configured to:

forgo triggering the action when the measured magnetic field strength is less than the threshold.

17. The system of claim 16, wherein the triggering apparatus configured to determine whether to trigger the action is configured to:

read the measured magnetic field strength in combination with at least the measured acceleration or the measured angular velocity when the measured magnetic field strength is greater than or equal to the threshold; and trigger the action based on the measured magnetic field strength in combination with at least the measured acceleration or the measured angular velocity.

18. The system of claim 17, wherein the triggering apparatus configured to trigger the action is configure to:

trigger the action by sending a signal to activate a show element, an effect, or an event.

19. The system of claim 17, wherein the triggering apparatus configured to trigger the action is configured to:

trigger the action by rewarding a prize associated with a game running on the triggering apparatus based on the measured magnetic field strength in combination with at least the measured acceleration or the measured angular velocity.

20. The system of claim 19, wherein the device is further configured to send a device identification to the triggering apparatus; and wherein the triggering apparatus is further configured to:

receive the device identification from the device, associate the prize with the device identification, and store the device identification and the associated prize in a database.

* * * * *